United States Patent
Raveh et al.

(10) Patent No.: US 11,664,187 B2
(45) Date of Patent: May 30, 2023

(54) BEAM STEERING CORRECTION FOR ATTENUATING THE DEGRADATION OF POSITIONAL ACCURACY OF CHARGED PARTICLE AND LASER LIGHT BEAMS CAUSED BY MECHANICAL VIBRATIONS

(71) Applicant: Intel Corporation, Santa Clara, CA (US)

(72) Inventors: Amir Raveh, Haifa (IL); Gideon Reisfeld, Haifa (IL); Patrick Pardy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 17/344,134

(22) Filed: Jun. 10, 2021

(65) Prior Publication Data
US 2021/0305009 A1    Sep. 30, 2021

(51) Int. Cl.
| | |
|---|---|
| *H01J 37/304* | (2006.01) |
| *H01J 37/153* | (2006.01) |
| *H01J 37/12* | (2006.01) |
| *H01J 37/14* | (2006.01) |
| *G02B 26/08* | (2006.01) |
| *H01J 37/244* | (2006.01) |
| *H01J 37/28* | (2006.01) |
| *H01J 37/305* | (2006.01) |
| *H01J 37/317* | (2006.01) |

(52) U.S. Cl.
CPC ........ *H01J 37/153* (2013.01); *G02B 26/0816* (2013.01); *H01J 37/12* (2013.01); *H01J 37/14* (2013.01); *H01J 37/244* (2013.01); *H01J 37/304* (2013.01); *H01J 37/28* (2013.01); *H01J 37/3053* (2013.01); *H01J 37/3174* (2013.01); *H01J 2237/153* (2013.01); *H01J 2237/24585* (2013.01)

(58) Field of Classification Search
CPC .............................. H01J 37/304; H01J 37/153
See application file for complete search history.

(56) References Cited

U.S. PATENT DOCUMENTS

| | | | |
|---|---|---|---|
| 6,403,973 B1 * | 6/2002 | Takahashi | ............. H01J 37/304 250/492.2 |
| 2009/0001266 A1 * | 1/2009 | Frosien | ................... H01J 37/30 250/306 |

* cited by examiner

Primary Examiner — Eliza W Osenbaugh-Stewart
(74) Attorney, Agent, or Firm — Essential Patents Group, LLP

(57) ABSTRACT

An apparatus comprising a beam emitter to emit a beam comprising electrons, ions or laser-light photons toward a target substrate. A motion sensor to detect mechanical vibrations of the target substrate. The motion sensor is mechanically coupled to the target substrate, a processor coupled to an output of the motion sensor. The processor is to generate a vibration correction signal proportional to the mechanical vibrations detected by the motion sensor, and beam steering optics coupled to the processor. The beam steering optics are to deflect the beam according to the vibration correction signal to compensate for the mechanical vibrations of the target substrate.

16 Claims, 9 Drawing Sheets

BEAM STEERING CORRECTION FOR ATTENUATING THE DEGRADATION OF POSITIONAL ACCURACY OF CHARGED PARTICLE AND LASER LIGHT BEAMS CAUSED BY MECHANICAL VIBRATIONS

BACKGROUND

High resolution and accuracy are major features of charged particle systems (e.g., a scanning electron microscope (SEM), electron beam (e-beam) lithographic tool or prober, focused ion beam (FIB) milling tool or laser direct-write lithography tool) that may be used for imaging, probing, inspection and milling. Another example is mechanical vibrations induced by a spray jet cooling system that are very challenging to reduce enough in order not to affect system resolution. In these systems vibrations may also be a substantial limitation on resolution and accuracy. Often the resolution, image quality or milling accuracy of such systems are limited by mechanical vibrations of the charged particle (electron or ion) column relative to the device or sample under inspection (DUI).

DETAILED DESCRIPTION

Figure 1:
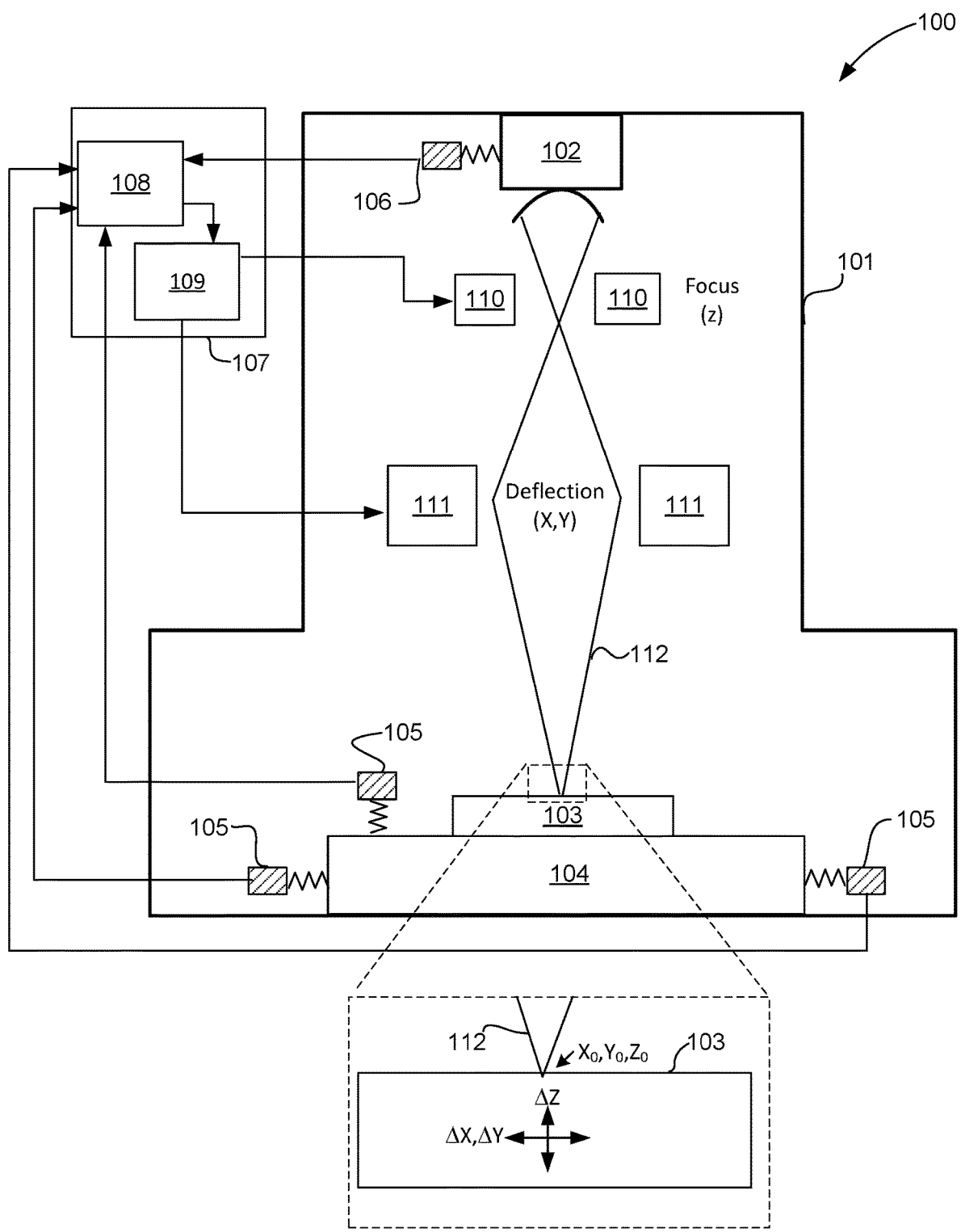
FIG. 1 illustrates a profile view in the x-z plane of a charged particle beam instrument 100, according to some embodiments of the disclosure.

Disclosed herein is an apparatus and method for partially or fully compensating the effects of mechanical and acoustic vibrations on the resolution, accuracy and milling acuity of charged particle and laser light systems. The disclosed apparatus and method comprise a feedback loop including motion sensors for the generation of a positional error signal that is superimposed on the primary beam-steering control signals. Beam steering circuitry is thus employed to compensate any vibrational motion of a target substrate due to mechanical vibrational energy coupled to a beam gun or target substrate. Consequently, higher resolution electron and ion columns may be obtained by using higher optical magnification that would not be possible with interference by mechanical vibrations.

The higher precision of beam positioning resulting from the methods and apparatus described in this disclosure may enable higher-precision probing of a DUI, or micromachining of smaller features on a target substrate than previously possible. As an example, smaller features, such as narrower vias, may be formed by beam steering-compensated FIB milling as described in this disclosure than would be possible by conventional ion milling tools. Similarly, systems employing steering of laser beams, such as a laser scanning microscope (LSM) for imaging or for probing signals, may equally benefit from the apparatus and methods of this disclosure.

An advantage of the disclosed apparatus and methods is that vibrational compensation is achieved by purely electronic control of the beam-steering electronics for charged particle beams, which are coupled to field beam steering devices such as magnetic beam focusing and deflection coil lenses or electrostatic lenses. Since electromechanical actuators are not employed, feedback loop bandwidth may be very high, enabling instantaneous correction of vibrational motion. In the case of laser beam steering, an array of mirrors may be employed, whereby each of the mirrors is rotated by an electromechanical actuator to deflect a laser beam in accordance with mechanical vibrations occurring on a target substrate, such as a DUI.

In some embodiments, the electromechanical actuators and mirrors may be highly integrated, such as in monolithic MEMS (microelectromechanical system) mirror arrays. The vibrational frequency of a MEMS mirror array may be several orders of magnitude higher than ambient vibrations to which the target substrate may be subjected. Consequently, the frequency response of the control loop may remain high enough to accurately respond to the ambient vibrations, whereby the control loop may match the highest frequency of the ambient vibrations, and have sufficient dynamic range to match the largest vibrational magnitude.

Mirror rotation may follow randomly varying vibrational frequencies and magnitudes with high fidelity to accurately deflect a laser beam, maintaining its position at a reference point (e.g., an x and y coordinate) on the surface of the target substrate as the substrate may vibrate laterally, introducing a positional uncertainty (e.g., $\Delta x$ and $\Delta y$) in response to ambient vibrational energy.

Uncertainty in vertical positioning (e.g., $\Delta z$) of a beam relative to a substrate may also be introduced by ambient vibrational energy. According to some embodiments, charged particle beams may correct for $\Delta z$ by rapidly changing the focal point of the beam. As an example, a charged particle (e.g., electron or ion) beam control loop may generate a correction signal directed to the magnetic focusing lens coils of the beam-steering optics to change the focal length of the magnetic lens. Thus, the focal point of the beam is moved along the z-axis by $\pm\Delta z$ at the frequency of the vibration causing $\Delta z$.

Purely electronic compensation of vibrational imprecision in beam positioning may have a significantly larger frequency response than mechanical vibration suppression systems, such as mechanical vibration dampening tables, active pedestals and suspension systems. The frequency response of a closed control loop is governed by its frequency response bandwidth, which may be limited by the component within the loop that has the lowest bandwidth. In active electromechanical vibration dampening systems such as active pedestals or isolation platforms, one or more actuators are under closed-feedback loop control.

The feedback loop may comprise an inertial motion sensor that is responsive to mechanical vibrational amplitudes and/or acceleration resulting from floor or building vibrations, as well as acoustical sources. The feedback loop may output signals to actuators that move the platform or pedestal in directions opposing the vibrational displacements, or to accelerate a mass in opposing directions to counteract a force created by the acceleration of the vibration.

A critically damped feedback control loop enables the actuators to move with equal but opposite acceleration with the mechanical vibrations detected by the motion sensor, while maintaining a 180° phase angle (e.g., correctional motion opposing the direction of the vibration disturbance). The open-loop resonant frequency of the mechanical components of the feedback loop may be several orders of magnitude below that of the controlling electronics. The open loop frequency response bandwidth of electromechanical systems may depend primarily on a particular system's size and stiffness. For example, MEMS devices generally have frequency response bandwidths that are orders of magnitude higher than analogous macroscopic systems.

Dampening vibrations by electromechanical systems such as active pedestals and vibration tables may have inherently lower frequency response bandwidths than purely electronic systems that have no mechanical component such as motors or actuators. Generally, vibrational disturbances in a research laboratory or semiconductor fab facility result from floor vibrations or ambient acoustical vibrations have frequencies that are mostly under 500 Hz, with vibrations under 100 Hz most prevalent. For example, vibrations occurring near 50 Hz and harmonics thereof may be generated by electric motors.

The disclosed apparatus employs a purely electronic feedback control loop. As such, system bandwidths may be well above the frequencies of mechanical and acoustical vibrations encountered in laboratories and fabrication facilities, avoiding resonances and potential oscillations. The disclosed apparatus comprises an electronic control module that comprises a central processing unit (CPU). In some embodiments, the CPU executes a feedback control loop algorithm encoded in software. One or more inertial motion sensors may be peripherally coupled to the CPU to provide input proportional to the vibrational magnitudes and frequencies. One or more motion sensors may be mechanically coupled to a target substrate.

For example, an accelerometer may be mechanically coupled to a substrate platform in a focused ion beam milling tool. In some embodiments, both lateral (e.g., $\Delta x$ and $\Delta y$) and vertical ($\Delta z$) vibrational motion may be detected and transduced by a single sensor. In some embodiments, multiple sensors may be coupled to the substrate platform. For example, two sensors are employed, one biaxial sensor detecting vibrational motion along orthogonal lateral axes (x and y), and a second sensor designed to measure motion on a single axis, employed as the z-axis motion sensor. In some embodiments, three single-axis sensors may be employed for detecting vibrational motion along each of the x, y and z axes.

In some embodiments, motion sensors may be mechanically coupled to a charged particle source, such as an electron or ion column that may be prone to mechanical vibrations. These sensors may be coupled to additional inputs on the CPU to provide vibrational displacements relative to a reference (e.g., a zero point) position of the source column so that a differential signal may be determined with respect to the column. The differential signal may be a difference signal between instantaneous displacements of the target substrate and the column.

In some embodiments, the inertial motion sensors are accelerometers. In some embodiments, the inertial motion sensors are linear position decoders. In some embodiments, the inertial motion sensors are interferometers. Inertial motion sensors may generally be any suitable sensor or device that can generate a signal (e.g., a voltage) that is proportional to positional displacements caused by vibrational motion.

The CPU may output an $\Delta x$ and/or $\Delta y$ correction signal that is proportional to the x and y motion sensor signals to an amplifier stage that is coupled to the CPU. The correction signals may be an analog voltage, amplified by an amplifier stage and sent directly to a beam-steering optical system comprising, for example, magnetic field or electrostatic lenses and deflectors, collectively referred to as beam optics. Magnetic field beam optics generally comprise an array of focusing and deflection coils that generate magnetic fields for focusing and deflecting charged particle beams passing through the magnetic fields. Electrostatic beam optics generally comprises an electrode array for deflecting and focusing charged particle beams by manipulating electric fields through which the particle beams pass. In some embodiments, the correction signal is summed with the beam pattern signal by the CPU. The summed signal may be output to the amplifier stage, which may send an amplified version of the summed signal to the beam optics.

In some embodiments, a separate signal generator, such as a peripheral DAC, may receive a stored waveform from the CPU and carry out the task of generating the x, y beam pattern by repeating the waveform continuously signal independently of the CPU. The x, y beam pattern signal may be summed with the instantaneous $\Delta x$ and/or $\Delta y$ correction signal that is generated and injected by the CPU to modify the beam pattern with the correction signal to compensate the $\Delta x$ and $\Delta y$ displacements of the target substrate relative to the beam. The static or dynamic zero-point beam position may be re-established. For example, an analog summing preamplifier outside of or within the amplifier stage may perform the summation. An amplified version of the summation signal comprising the sum of the correction signal and the beam pattern signal may be developed in an amplifier stage and output to the beam optics.

In this disclosure, it is understood that the terms "over", "under", "above", "below", "upper", "lower", "top" and "bottom" have the usual structural meanings, referring to relative vertical positions within structural embodiments and to their immediate environment as viewed within the associated figures. Similarly, the terms "left", "right", "side" and "sideways" have the usual structural meanings, referring to relative horizontal positions within structural embodiments and within their immediate environment as viewed within the associated figures.

The terms "substantial" or "substantially" are used within this disclosure to mean "the greater part of", "mostly" or "mostly to fully". For example, "substantially" may qualitatively indicate a measure within 10% of a quantifiable attribute, with the possibility that the measure may range from 90% to 100% of the quantifiable attribute.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates a profile view in the x-z plane of charged particle beam instrument 100, according to some embodiments of the disclosure.

Charged particle beam instrument 100 comprises vacuum chamber 101 enclosing beam source 102, target substrate (or device under inspection, DUI) 103. Vacuum chamber 101 may be under a high vacuum (e.g., $<10^{-7}$ torr) or an ultra-high vacuum (e.g., $<10^{-10}$ torr) to mitigate collisions of charged particles with air or gas molecules. Target substrate or DUI 103 is supported on stage 104. Motion sensors 105 are disposed in proximity to target substrate 103, and may be mechanically coupled to stage 104. As shown in the illustrated embodiment, three motion sensors 105 are coupled to stage. Target substrate 103 may be rigidly affixed to stage 104 (stage 104 may be rigidly affixed to the base or walls of vacuum chamber 101), thus vibrational motion of stage 104 may be translated to target substrate 103. Thus, motion sensors 105 may directly measure the vibrational motion of target substrate 103. Optionally, one or more additional motion sensors 106 may be coupled to beam source 102. In some embodiments, motion sensors 105 may be part of a jig to affix target substrate 103 to stage 104, thus having a direct mechanical coupling to target substrate 103.

In some embodiments, source 102 is a charged particle (electron or ion) source comprising positive electrodes (e.g., anodes) to collimate and accelerate the generated charged particles. The charged particle source may produce electrons for an electron beam by thermionic emission of a heated filament. Ion beams may be produced by ionization of liquid metals, such as gallium or ionization of noble gas ions (e.g., argon, xenon) by various ionization techniques (e.g., liquid metal ionization sources, noble gas plasma formation) known in the art.

In some embodiments, electronic control module 107 comprises CPU 108 and amplifier stage 109. Motion sensors 105 and 106 may be electrically coupled to electronic CPU 108, which may read digitized output signals (e.g., as voltages) from motion sensors 105 and 106. Signals output from motion sensors 105 and 106 may be proportional to vibrational motion of target substrate 103 and/or beam source 102. CPU 108 may compute an error signal that is related to the motion sensor signals. For example, CPU 108 may subtract a reference value from the raw sensor signals. The reference value may be related to a zero-position of target substrate 103, where the zero-point position is an x, y and z coordinate (e.g., x0, y0, z0) of a reference point on target substrate 103 having no vibrational motion.

This is shown in the inset of FIG. 1, where charged particle beam 112 impinges on target substrate 103. In a vibration-free system, charged particle beam 112 may be positioned at coordinate x0, y0, z0. Realistically, vibrations may be continuously present. Vibrational motion of target substrate 103 with respect to charged particle beam 112 may be represented by arrows labeled $\Delta x$, $\Delta y$ and $\Delta z$. The vibrational motion introduces an uncertainty in the incident position of charged particle beam 112 on target substrate 103. The vibrationally modulated position of charged particle beam 112 may be $x0+\Delta x$, $y0+\Delta y$ and $z0+\Delta z$.

Magnetic beam optics generally comprise an array of focusing and deflection coils, thus may require some degree of power to generate sufficient magnetic flux for controlling a charged particle beam (e-beam or ion beam). Electrostatic beam optics generally comprises an electrode array for deflecting and focusing charged particle beams. Large voltages may be applied to subsets of electrodes to steer, focus or diverge a charged particle beam. Electrostatic optical systems may generally have significantly smaller power requirements than magnetic optical systems due to the small displacement currents that may flow between the electrodes as the voltages are rapidly varied.

Beam focusing optics 110 and beam deflection optics 111 may comprise electromagnet coils in a symmetric arrangement of coils, such as a toroidal or quadrupolar configuration, for generating controllable symmetric and asymmetric magnetic field gradients to deflect charged-particle beam 112 along the x and y axes according to Lorentz's law. Magnetic fields may be generated by flowing currents through coils contained within deflection beam optics 111 and focusing beam optics 110. Electronic control module 107 may source currents by coupling beam optics 110 and 111 to amplifier stage 109, which may comprise a power amplifier to generate sufficient currents to generate the required magnetic fields.

In some embodiments, beam deflection optics 111 comprise an electrode array for creating a dynamic electric field through which charged-particle beam 112 passes. Electric fields may be generated by imposing voltages on an electrode array within beam deflection optics 111. Charged particle beams may be subject to Lorentz forces caused by controlled electric field gradients, causing controlled deflection of charged-particle beam 112. High voltages required to generate sufficient electric fields may be generated by a voltage amplifier stage within amplifier 109.

Beam focusing optics 110 may cause charged particle beam 112 to converge and diverge, changing the focal point and hence the spot size. At the focal point, the beam diameter may be at a minimum. Beam focusing optics 110 may be operated to set the focal point of charged particle beam 112 to coincide with the surface of target substrate 103.

Amplifier 109 may comprise multiple voltage and/or power amplifiers that are coupled to beam optics 110 and 111 Electrostatic optics may present high impedances to the output of amplifier 108, thus power requirements of amplifier 108 may be small, not necessitating power amplification. Electromagnetic optics may require large currents and present low impedances to amplifier 108, imposing higher power requirements. Thus, amplifier 108 may have power delivery capabilities.

Embodiments of feedback control loops to compensate vibrational motion of a target substrate by controlling beam optics of charged particle and laser light beam devices are described below.

Figure 2:
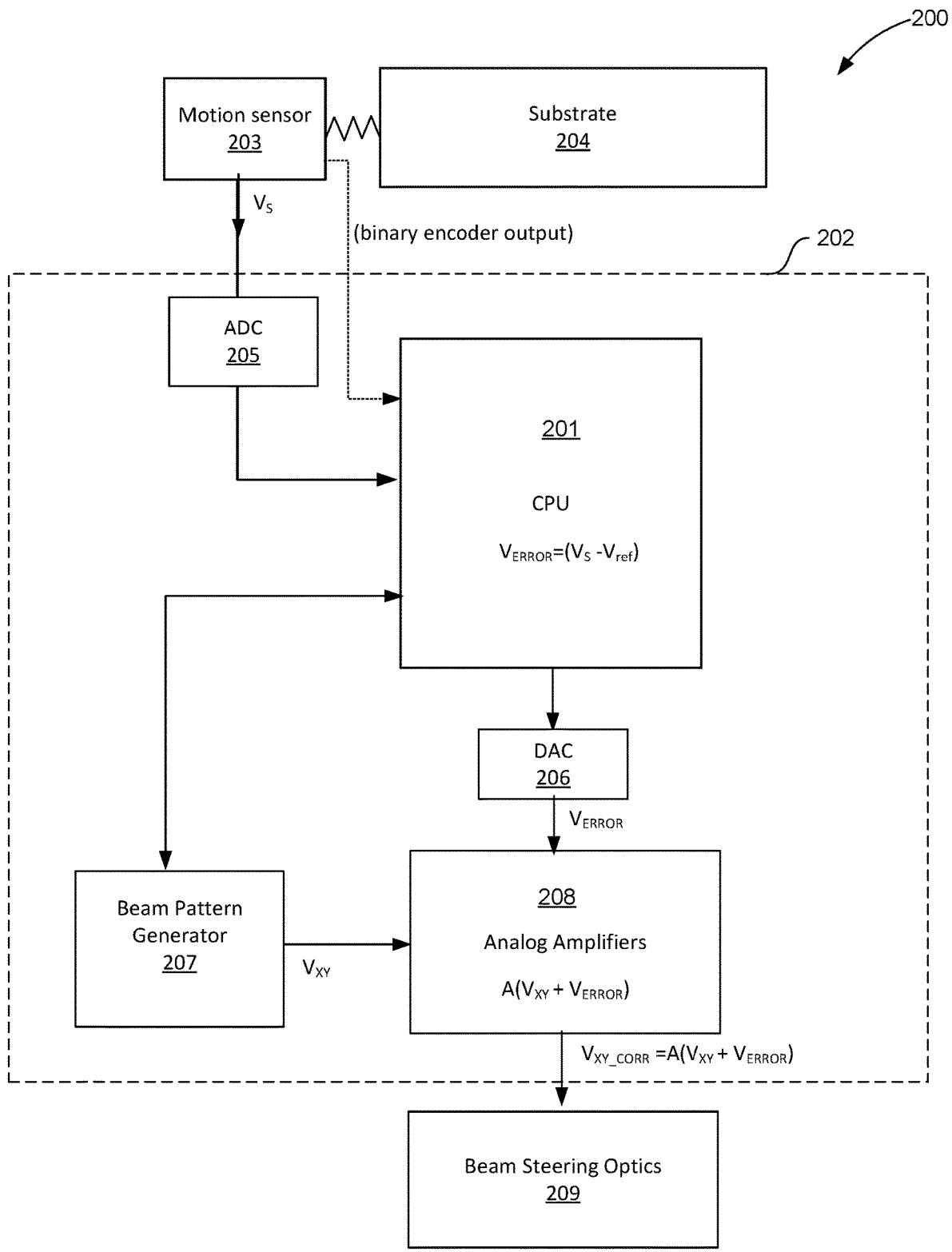
FIG. 2 illustrates a block diagram of a first embodiment of an exemplary feedback control loop for compensation of vibrational motion for a beam instrument, according to some embodiments of the disclosure.

FIG. 2 illustrates a block diagram of exemplary feedback control loop 200 according to some embodiments of the disclosure.

Feedback control loop 200 comprises CPU 201 as a hub for system inputs and outputs. According to some embodiments, CPU 201 is contained within electronics control module 202, as shown in FIG. 1. CPU 201 may provide embedded digital signal processing within feedback control loop 200. CPU 201 may be distributed as multiple discrete processors. In some embodiments, CPU 201 may be a multicore processor. CPU 201 may be coupled to a memory that is integrated within its package, or contained in a separate package. Software comprising feedback control loop algorithm code may be stored in the memory and executed by CPU 201.

Feedback control loop 200 further comprises motion sensor 203 mechanically coupled to target substrate 204. As noted above, motion sensor 203 may an inertial or displacement sensor such as, but not limited to, an accelerometer, an interferometer or a linear position decoder. Motion sensor 203 may measure vibrational motion along a signal axis channel (e.g., x or y) or along multiple axis channels (e.g., x and y or x, y and z).

Motion sensor 203 may generate a voltage or current proportional to a vibrational displacement. For example, motion sensor 203 may be an inertial sensor such as an accelerometer, measuring inertial forces exerted by vibrational movement. The inertial forces are proportional to accelerations of a test mass within sensor 203. Thus, the output signal generated by motion sensor 203 is proportional to acceleration of the test mass. However, the acceleration may a direct measure of the acceleration of target substrate 204 due to vibrational displacement. The output signal generated by motion sensor 203 (as an inertial sensor) may be a voltage Vs proportional to the acceleration rate.

In some embodiments, motion sensor 203 is sensitive to displacements. For example, as an interferometric sensor or a linear position encoder sensor, motion sensor 203 detects changes in position due to vibrational displacements of target substrate 204. In some embodiments, motion sensor 203 outputs a digital value corresponding to encoded position measurement, for example, as a quadrature signal (e.g., A quad B). The encoded value may correspond to a vibrational displacement distance (e.g., a Δx or Δy measured in nanometers or picometers). A digital output of the motion sensor 203 may be coupled to CPU 201 by a serial or parallel interface, indicated by the stippled connector line between motion sensor 203 and CPU 201 in the block diagram of FIG. 2. It may be understood that motion sensor 203 may be a sensor head that detects the motion, mechanically or optically coupled to target substrate 204, whereby the sensor head is remote from an external sensor control circuit.

Interferometric sensor optics may comprise a Michaelson-type interferometer configuration within a sensor head comprising miniaturized and integrated optical components. The sensor head may be remote from a separate sensor control unit (e.g., comprising sensor-specific electronics). A laser source within the control unit may be coupled to the sensor head by an optical fiber. An interference pattern developed within the sensor head may be transferred to the control unit by the optical fiber, where the pattern may be converted to an encoded digital signal. The encoded digital signal sensor output may be coupled to one (serial) or multiple (parallel) digital inputs of CPU 201, as indicated by the stippled connector in FIG. 2. A reference beam formed within an interferometric sensor head by an internal beam splitter may be effectively immune to vibrations, therefore providing an absolute measurement of vibrational displacements of target substrate 204.

Vs may comprise multiple analog voltage signals for each axis channel if motion sensor 203 is so configured. Sensor signal Vs may be a voltage coupled to CPU 201 through ADC 205, and converted to binary data and input to CPU 201. ADC 205 may be a discrete analog-to-digital converter or integrated with CPU 201. Vs may be output as an analog voltage from both an accelerometer motion sensor or an interferometric motion sensor. For example, Vs may be proportional to the inertial force experienced by an internal proof mass within the body of the accelerometer (e.g., $Vs \sim a = kx/m$, where m is the mass of the proof mass, k is a spring constant of an internal cantilever coupled to the proof mass and x is a displacement of the cantilever measured piezoresistively or capacitively). Accelerations measured by the accelerometer are substantially the same as the accelerations of target substrate 204 due to vibrational motions. Instantaneous values of Vs may be processed to compute an incremental displacement by integration. The integration may be performed digitally by CPU 201 executing an algorithm within the software, or non-digitally by an analog operational amplifier circuit within electronic control module 202, coupled to CPU 201 (not shown). Alternatively, Vs may be directly read by CPU 201 as an acceleration signal (e.g., second time derivative of the displacement, $\partial^2 \Delta x/\partial t^2$) to compute a series of projections of instantaneous positions of target substrate 204 at successive time increments.

Based on the input from motion sensor 203, CPU 201 may compute a correction signal for compensation of the vibrational motion. As shown in FIG. 2, CPU 201 may output binary data to DAC 206 for conversion to an analog voltage signal Verror. In some embodiments, Verror is output multiple times during a single vibration cycle, as described below. The correction signal Verror may be determined computationally by subtracting a reference value from the raw sensor signal(s). The reference value may be related to a reference position of the target substrate platform, for example. In some embodiments, the reference position is at a calculated (e.g., undisturbed) x, y beam coordinate on target substrate 204, where Δx and Δy are zero. In some embodiments, Vs may be referenced internally to a zero value within motion sensor 203, as noted in the above example of an interferometric position sensor.

As noted above, any vibrational motion of the charged particle source column may also be measured and input to the CPU, whereby a differential correction signal value may be computed to correct or compensate vibrational motion along the x- and/or y-axes. A correction signal, single-ended or differential, may be generated by the CPU or by one or more digital-to-analog converters (DACs) coupled to the CPU output(s).

In the illustrated embodiment, beam pattern generator 207 is peripheral to CPU 201. In some embodiments, beam pattern generator 207 may comprise a pair of DACs to synthesize x and y raster signals, or to output stationary x and y beam position signals to hold the beam at one position on target substrate 204 (e.g., for ion milling or e-beam probing). Beam pattern generator 207 may receive binary data from CPU 201 to convert to analog voltages. Beam pattern generator may comprise an embedded memory to store or buffer waveform data sent from CPU 201. CPU 201 may also set and clear bits in control registers on beam pattern generator 207 to initiate and stop DAC output.

Beam pattern generator 207 may output a beam pattern signal Vxy such as a x-scan and y-scan sawtooth or triangle waveforms. The waveform may be output as a train of analog voltages that are incremented at precise time intervals. The time interval may be determined by dividing the number of waveform points into waveform period, as described below. Alternatively, beam pattern generator 207 may comprise an analog signal generator, for example to generate an analog sawtooth or triangle wave. CPU 201 may control such an analog circuit by use of logic gates to trigger and stop an analog signal train. At each voltage increment, Vx and Vy may cause a charged particle or laser beam to deflect incrementally in a rectilinear raster pattern over the surface of target substrate 204.

In general, the beam pattern signal may be any suitable or arbitrary waveform, including a static voltage to position a beam at a particular x-y coordinate on target substrate 204 for probing or milling operations.

Still referring to FIG. 2, Vxy and Verror are fed to amplifier stage 208. A summing operational amplifier may sum Vxy and Verror together to combine the positional correction signal based on the output from motion sensor 203 with the beam pattern signal. Any vibrational motion detected by motion sensor 203 may be compensated by superimposing a correction signal on the basic beam pattern signal in real time. It may be understood that Vxy comprises separate signals Vx and Vy, while Verror may also comprise separate real-time correction signals for compensation of vibrational offsets $\Delta x$ and $\Delta y$ of target substrate 204.

Amplifier stage 208 may provide voltage and/or power amplification of the combined signal Vxy+Verror, depending on power requirements of beam steering optics 209, as described above. Amplification factor A may be any value greater or equal to unity. Beam steering optics may comprise separate focusing and deflection optics, as described above and shown in FIG. 1.

In some embodiments, the bandwidth of the feedback loop is 100 kHz or greater to follow instantaneous changes in the velocity of a vibrational displacement, even at relatively low vibrational frequencies under 100 Hz. For example, an accelerometer motion sensor may be well suited to measure the acceleration related to a vibrational displacement. The signal from the accelerometer may be proportional to the acceleration. A minimum processing speed of the CPU is required to enable the CPU to poll and process the sensor signal to generate a correction signal at intervals of 10 microseconds or less in order to compensate the vibrational displacement in real time. Consequently, the beam pattern signal may be updated repeatedly at each 10-microsecond interval to inject instantaneous $\Delta x$ and $\Delta y$ corrections to the beam optics.

The beam optics may continuously deflect the beam according to the $\Delta x$ and $\Delta y$ correction voltage signals, which may be superimposed on the beam pattern voltage signal during each update cycle of 10 microseconds or less, forming a corrected beam pattern signal. For example, a beam pattern signal may comprise two digital sawtooth waveforms, a first digital sawtooth waveform to be fed to x-deflection beam optics and a second digital sawtooth waveform to be fed to y-deflection beam optics. A digitized $\Delta x$ correction voltage signal may be summed with the digital x-deflection signal.

As an example, an x scan frequency of 120 Hz whereby a sawtooth or triangle waveform is repeated 120 times per second may comprise 1024 data points. The waveform is incremented by $1/1024$ the maximum voltage 122,880 times per second, or approximately every 8 microseconds. For a critically damped feedback loop, the instruction cycle executed by the CPU updates and outputs the correction signal approximately every 8 microseconds. A DAC may transform the binary data representing the correction signal to a voltage, which may be summed with the beam pattern waveform by an analog summing amplifier. The beam optics may deflect the beam to follow the vibrational motion along the x and y axes.

Continuing the example, for a high vibrational frequency of 10 kHz, a vibration cycle is 100 microseconds long. Accordingly, approximately 12 updates per vibration cycle may occur. To completely suppress the displacement, the control loop must be critically damped so that the deflections of the beam are in phase with the vibrational motion. Effectively, the beam deflections may be critically damped (e.g., follow the vibration with high fidelity) when the number of samples captured per vibration cycle equal to or above a minimum number to ensure that the beam follows the vibrational motion. In an underdamped control loop where the sample rate is too low, the beam may not follow the vibrational motion with any fidelity, possibly exhibiting aliasing and large phase shifts. In an overdamped control loop, the frequency response bandwidth of the system may be too small to keep up with the correction signal. The low bandwidth may be due to slow digital components (e.g., CPU or DAC) or low amplifier slew rate. (e.g., amplifier bandwidth).

Figure 3:
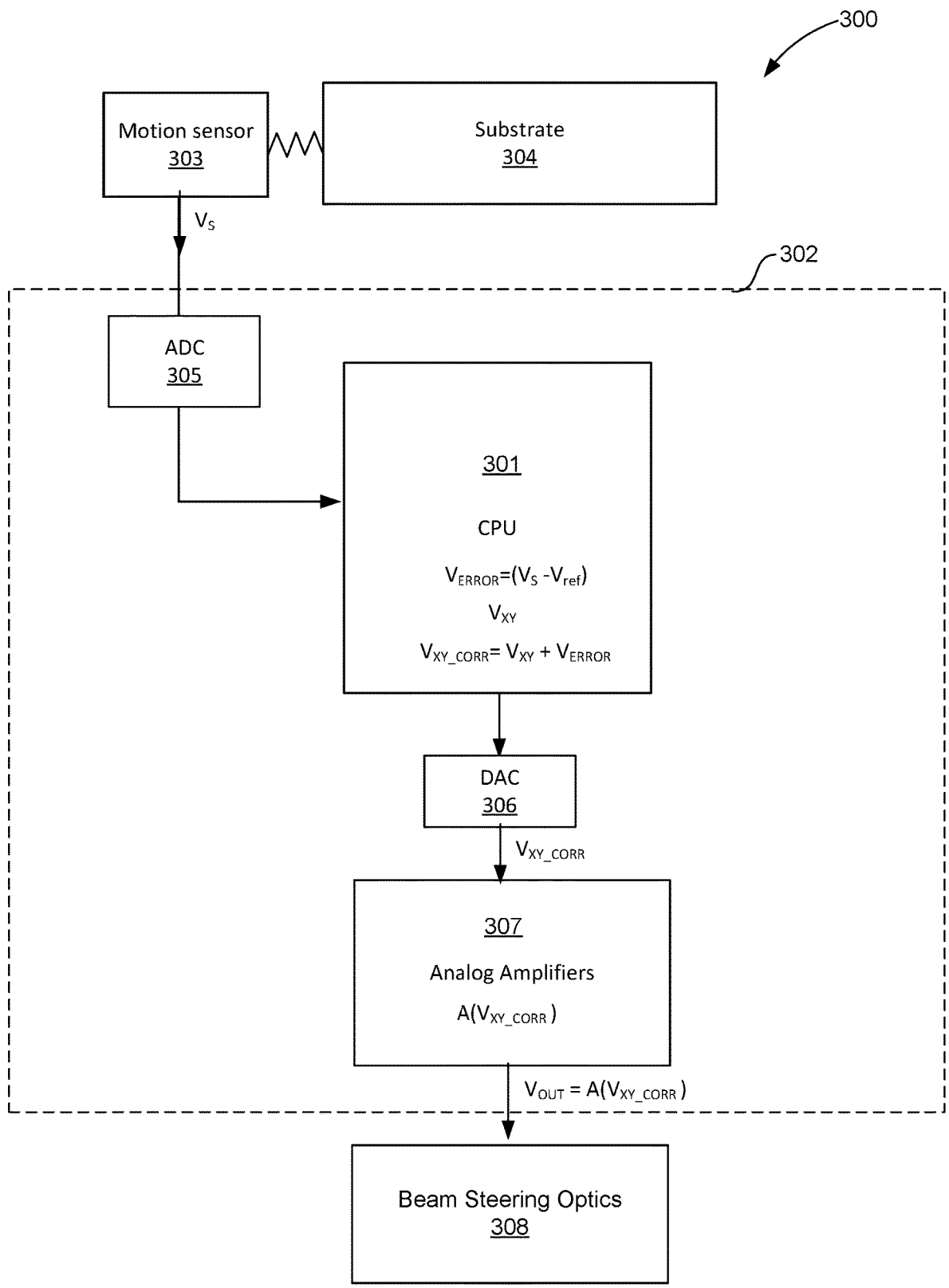
FIG. 3 illustrates block diagram of a second embodiment of an exemplary feedback control loop for compensation of vibrational motion for a beam instrument, according to some embodiments of the disclosure.

FIG. 3 illustrates block diagram 300 of an exemplary feedback control loop according to some embodiments of the disclosure.

Feedback control loop 300 comprises CPU 301 as a hub for system inputs and outputs within feedback control loop 300. CPU 301 may be substantially identical to CPU 201 in FIG. 2. CPU 301 may be an embedded processor within feedback control loop 300, interconnected to peripheral components within electronic control module 302, represented within FIG. 3 as the dashed enclosure. CPU 301 may be coupled to a memory on which executable instructions are stored for creating an error signal and beam pattern signal, as described below.

As shown in FIG. 3, motion sensor 303 is mechanically coupled to target substrate 304. Motion sensor 303 may be an inertial sensor such as an accelerometer. In some embodiments, motion sensor 303 is a interferometric sensor or a linear position sensor, capable of measuring displacements of less than 10 nm in position of target substrate 304. Motion sensor 303 is mechanically coupled to target substrate 304. CPU 301 may read input from motion sensor 303 (e.g., Vs) that is converted to a binary signal through ADC 305. As noted above, motion sensor 303 may comprise x, and y channels for lateral vibrations of target substrate 304. Vs may comprise multiple voltage signals corresponding to $\Delta x$ and/or $\Delta y$ vibrational displacements of target substrate 304. CPU 301 may compute a Verror value by subtracting a reference value from the Vs from motion sensor, which may be a raw voltage that is proportional to the instantaneous acceleration or positional displacement of target substrate 304. In the illustrated embodiment, CPU 301 may execute a software loop for generating beam pattern signals in the form of Vxy values in addition to providing the correction signal Verror. CPU 301 may digitally sum the values corresponding to Vxy with Verror values before outputting the summed values Vxy+Verror to DAC 306.

DAC 306 may convert the Vxy+Verror to an analog voltage that is input to amplifier stage 307. As described above, amplifier stage may comprise separate amplifiers for x and y channels. The amplification factor A may be adjusted for the voltage and/or power requirements of beam steering optics 308. In some embodiments, CPU 301 may execute instructions to refer to a lookup table stored in an associated memory to obtain data for Vxy. In some embodiments, CPU 301 executes instructions to compute each binary value of Vxy and store the computed values in a memory buffer, or output each computed value directly to DAC 306.

Figure 4:
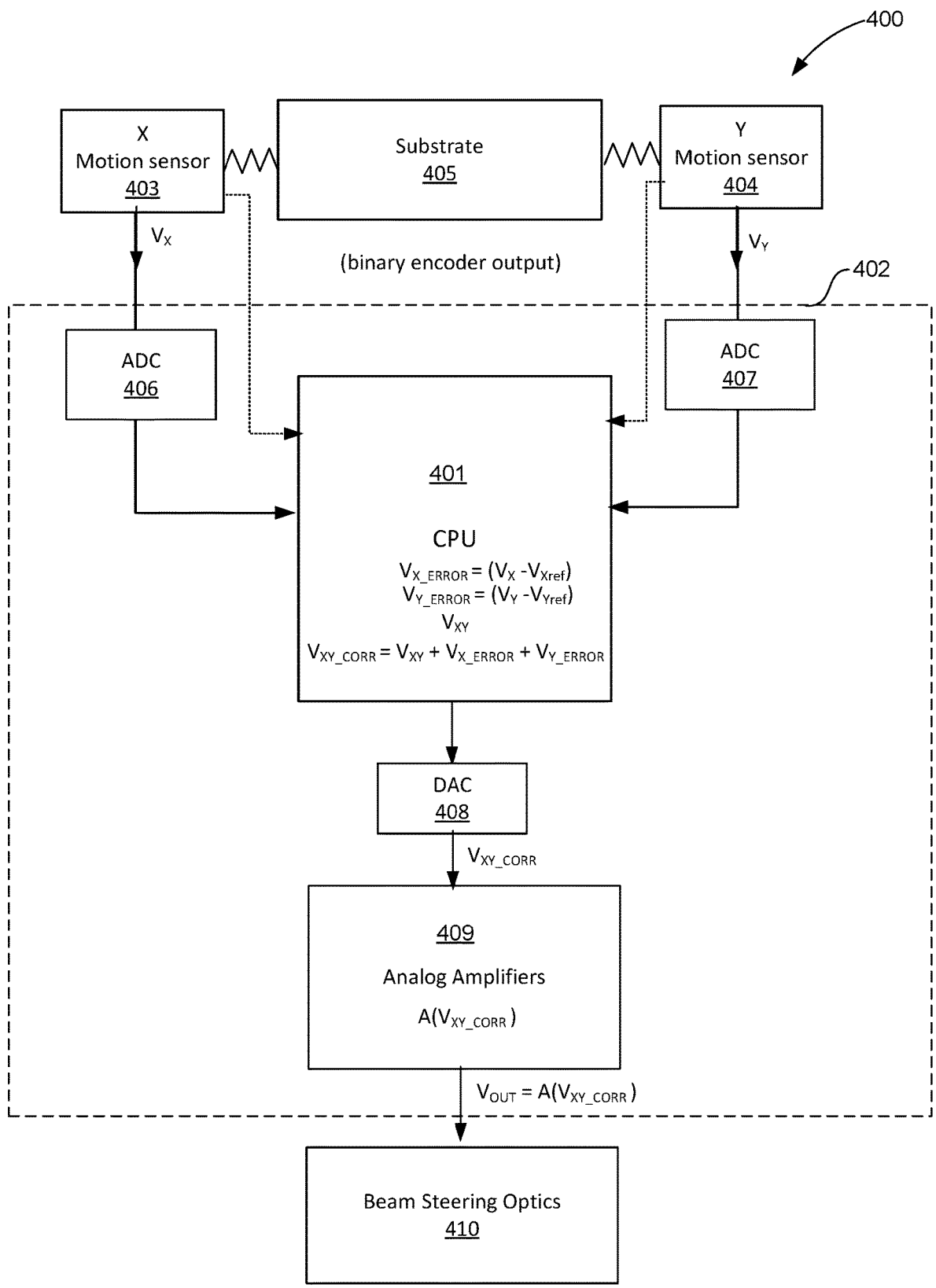
FIG. 4 illustrates a block diagram of a third embodiment of an exemplary feedback control loop for compensation of vibrational motion for a beam instrument, according to some embodiments of the disclosure.

FIG. 4 illustrates a block diagram of exemplary feedback control loop 400 for compensation of vibrational motion for a beam instrument, according to some embodiments of the disclosure.

Feedback control loop 400 comprises CPU 401 as a hub component of electronic control module 402. In the illustrated embodiment, CPU 401 receives input from two separate motion sensors 403 and 404. Motion sensor 403 may be mechanically coupled to target substrate 405 in such a way that it generates an output signal related exclusively to vibrational motion along a single axis (e.g., the x axis). Similarly, motion sensor 404 may be mechanically coupled to target substrate 405 to sense vibrational motion along an axis that is orthogonal to motion sensor 403 (e.g., the y-axis).

CPU 401 may compute x- and y-channel correction signals from each of the two motion sensors 403 and 404. ADCs 406 and 407 may convert analog voltages from motion sensor 403 and 404, respectively, to binary data that is read by CPU 401. In some embodiments, one or both of motion sensors 403 and 404 may output a binary signal comprising encoded positional data, as indicated by the stippled connectors between motion sensors 403 and 404 and CPU 401. In some embodiments, motion sensors 403 and 404 are both inertial sensors, such as accelerometers as described above. In some embodiments, motion sensors 403 and 404 are both positional sensors, such as interferometric sensors as described above. In some embodiments, motion sensors 403 and 404 are different motion sensors. For example, motion sensor 403 may be an accelerometer to detect vibrational motion along the x axis, while motion sensor 404 may be an interferometric positional sensor to detect vibrational motion along the y-axis.

In the illustrated embodiment, CPU 401 may compute correction signals Vx_error and Vy_error in real time by subtracting reference values from each raw signal Vx and Vy input from each of motion sensors 403 and 404. CPU 401 may also compute beam pattern signals Vxy in a manner similar to that described above for CPU 301. Direct computations may be employed, where CPU 401 computes and stores Vxy data in a buffer that is transferred to DAC 408. The beam pattern signals Vxy may be computed and stored in memory before a beam operation begins. Thus, Vxy values may remain static. In some embodiments, CPU 401 reads binary values from a lookup table pre-loaded in a memory coupled to CPU 401.

In the illustrated embodiment, CPU 401 sums Vx_error and Vy_error data in real time with individual Vxy binary data. For example, Vx_error may be summed with each individual x-channel data point of a sawtooth raster scan waveform. Similarly, Vy_error may be summed with each individual y-channel data point of the sawtooth raster scan waveform. The summed values may be sent to DAC 408 as individual binary values, and subsequently output to amplifier stage 409 as analog voltages Vxy_corr, where Vxy_corr represents beam pattern signals modified with correction voltages to compensate vibrational motion of target substrate 405 along the x-axis and y-axis in real time Amplifier stage 409 may output an amplified version if Vxy_corr to beam steering optics 410, whereby Vxy_corr comprises the Vx_error and Vy_error signals and beam pattern signals Vxy as components of the Vx and Vy beam deflection signals. Beam steering optics 410 may comprise beam deflection optics to defect a charged particle beam or a laser beam along the x-axis according to Vx+Vx_error and along the y-axis according to Vy+Vy_error. As described above, discrete points of beam pattern signals Vx and Vy may be updated in real time to deflect the beam in the direction of the vibration displacement in order to compensate the vibrational motion.

Figure 5:
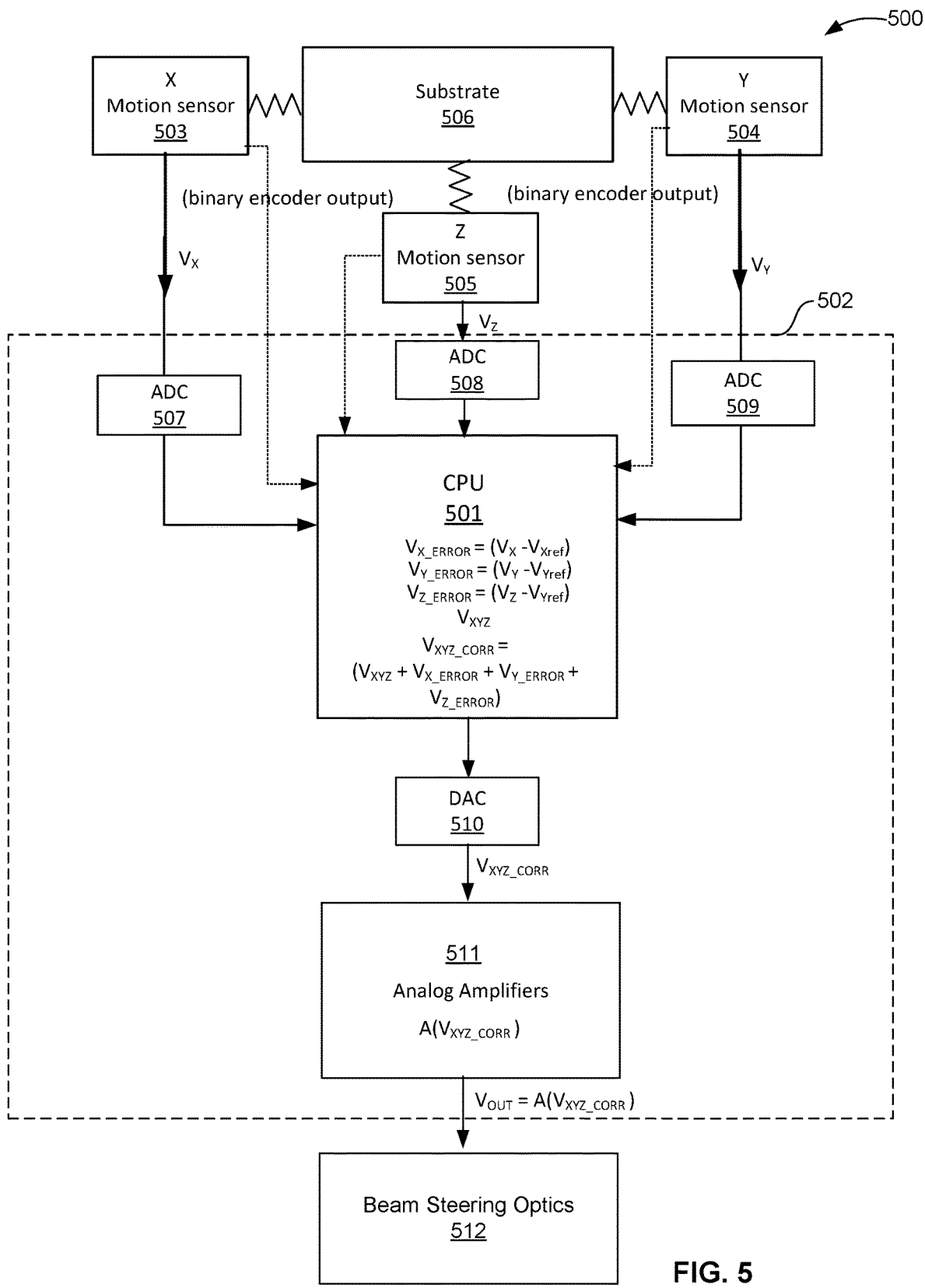
FIG. 5 illustrates a block diagram of a fourth embodiment of an exemplary feedback control loop for compensation of vibrational motion for a beam instrument, according to some embodiments of the disclosure.

FIG. 5 illustrates a block diagram representing exemplary feedback control loop 500 for compensation of vibrational motion for a beam instrument, according to some embodiments of the disclosure.

Feedback control loop 500 comprises CPU 501 as a hub component within electronic control module 502. In the illustrated embodiment, CPU 501 is coupled to motion sensors 503, 504 and 505, each mechanically coupled to target substrate 506. In the illustrated embodiment, motion sensor 503 and 504 are coupled to target substrate 506 along an x-axis and a y-axis, respectively. A third motion sensor 505 may be coupled to target substrate 506 along a z-axis. Motion sensors 503, 504 and 505 may be substantially as described above. Outputs from motion sensors 503, 504 and 505 may be output as analog voltages, for example, and coupled to CPU 501 through ADCs 507, 508 and 509, respectively. In some embodiments, motion sensor 503-505 output binary encoded positional data, as described above. The binary encored data may be directly coupled to digital inputs of CPU 501, as indicated by the stippled connector lines in FIG. 5.

CPU 501 may compute real-time error signals Vx_error, Vy_error and Vz_error based on inputs from motion sensors 503-505, respectively. In the illustrated embodiment, CPU 501 may subtract reference values from the raw Vx, Vy and Vz input channels. Reference values may be based on a zero-point position, for example, of target substrate 506. In some embodiments, beam pattern signal Vxyz data may be preloaded into a lookup table buffer of a memory coupled to CPU 501. In the illustrated embodiment, the beam pattern signals include a z-control voltage. The z-control voltage may adjust beam focus along a z-axis perpendicular to target substrate 506. The beam focal point may coincide with the beam waist, or narrowest portion of the beam. Thus, the spot size of the beam on the surface of target substrate 506 may be minimized by adjustment of the beam focus optics as described below.

In some embodiments, CPU 501 may compute a corrected version of beam pattern Vxyz by summing Vx_error, Vy_error and Vz_error with each component of Vxyz, (e.g., Vx, Vy and Vz of the beam pattern) in real time. CPU 501 may compute correction values Vx_error, Vy_error and Vz_error in real-time, and output the correction values to DAC 510 in real time. As noted above, each point of a x and y raster scan signal may be updated by summation with Vx_error and Vy_error before being output to DAC 510. In the illustrated embodiment, the z-signal is also corrected for vibrational displacements of target substrate 506 along the z-axis. A z-axis control signal Vz may be summed in real time with Vz_error. Vz may be a static voltage to fix the beam focus, for example, at a pre-determined plane that coincides with the surface of target substrate 506, or at other planes that are below the surface of target substrate. For example, a tomographic analysis of target substrate may be recorded by depth-profiling Auger spectroscopy, whereby an electron probe beam is incident on a target substrate (e.g., target substrate 506) to eject secondary Auger electrons from various depths below the surface of target substrate 506 as the spot is simultaneously sputtered by a focused ion beam. The ion beam or the electron probe beam may be re-focused at each depth level by adjusting beam focusing optics. Focused ion beams (FIB) may be employed to similarly penetrate the surface of target substrate 506 to locally sputter the surface to create three-dimensional structures. A focused-ion beam may be re-focused at each depth to regain a minimum spot size. As noted above, focused-ion beams may have a spot size as small as 2 nm.

However, random displacements along the z-axis due to vibrational motion of target substrate 506 may defocus the beam. The correction signal Vz_corr may compensate the vibrational displacements by following the vibrational displacement along the z-axis and immediately refocusing the beam up and down, following the displacement occurring along the z-axis in real time.

Vxyz_corr may be represent the collective corrected beam steering channel signals, comprising Vx_corr, Vy_corr and Vz_corr output to amplifier stage 511. Amplifier stage 511 may comprise one or more amplifiers for each channel. The amplified signals, represented by A(Vxyz_corr) in the figure, are output to beam steering optics 512. Beam steering optics 512 comprise beam focus optics that receive the Vz_corr signal, enabling correction of beam focus in real time to follow vertical vibrational displacements of target substrate 506.

Figure 6:
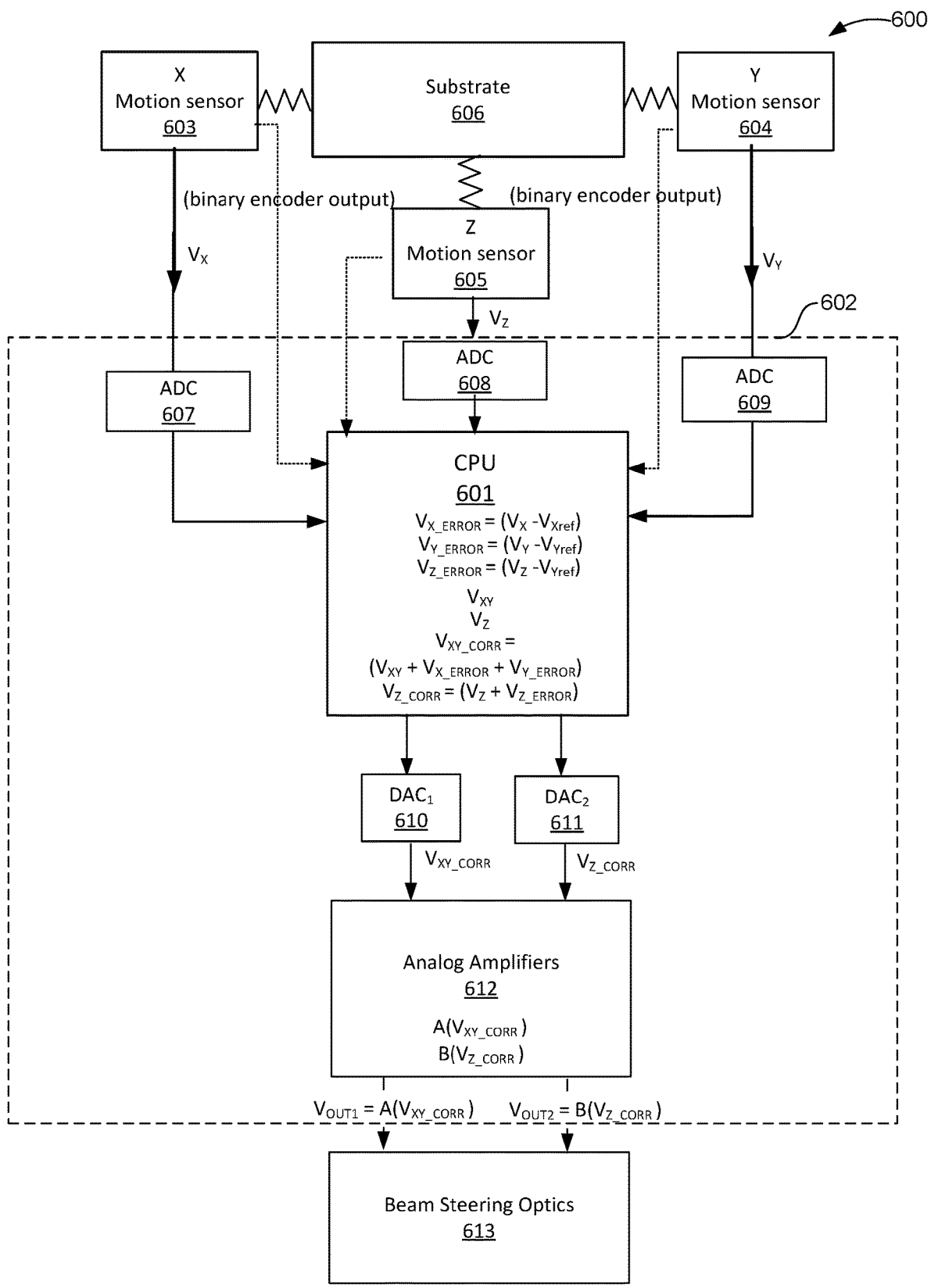
FIG. 6 illustrates a block diagram of a fifth embodiment of an exemplary feedback control loop for compensation of vibrational motion for a beam instrument, according to some embodiments of the disclosure.

FIG. 6 illustrates a block diagram representing exemplary feedback control loop 600 for compensation of vibrational motion for a beam instrument, according to some embodiments of the disclosure.

Feedback control loop 600 comprises CPU 601 as the hub component within electronic control module 602. In the illustrated embodiment, CPU 601 is coupled to motion sensors 603, 604 and 605, each mechanically coupled to target substrate 606. Motion sensors 603, 604 and 605 may be substantially the same as motion sensors 503, 504 and 505, described above. Motion sensor 603-605 may output signals Vx, Vy and Vz, respectively, that are proportional to vibrational motion or displacements along an x-axis, a y-axis and a z-axis of target substrate 606. Output signals Vx, Vy and Vz be coupled to CPU 601 through ADCs 607, 608 and 609, respectively. Alternatively, motion sensors 603-605 may output binary encoded signals indicated by the stippled connector lines in the figure that are directly read by CPU 601, as described above.

CPU 601 may compute error correction signals Vx_corr, Vy_corr and Vz_corr by subtracting reference values from the raw motion sensor channel inputs. Alternatively, sensor inputs may be internally referenced by the sensor and the referenced sensor value output to CPU 601, as described above for some interferometric position sensors (and linear encoded position sensors). CPU 601 may generate a corrected beam pattern signal as described above by summing Vx_corr, Vy_corr and Vz_corr with corresponding beam pattern signals Vx, Vy and Vz. As noted above, Vx, Vy and Vz values may be store in a retrievable lookup table.

In the illustrated embodiment, lateral correction values Vxy_corr and vertical correction values Vz_corr are output to separate DACs 610 and 611, respectively. Multiple separate DACs may be advantageous for efficient correct of lateral vibrational displacements and vertical vibrational displacements. For example, DAC 610 may output lateral correction signals Vx_corr and Vy_corr at a faster rate than necessary for Vz_corr output by DAC 611. DACs 610 and 611 may output correction signals Vx_corr and Vy_corr, and Vz_corr, respectively, to amplifier stage 612. Separate amplifiers within amplifier stage 612 may be employed to amplify Vx_corr, Vy_corr and Vz_corr. In the illustrated embodiment, Vx_corr and Vy_corr may be multiplied by the same amplification factor A, while Vz_corr may be multiplied by amplification factor B.

Amplified correction signals represented by A(Vxy_corr) and B(Vz_corr) may be output from amplifier stage 612 to beam steering optics 613. As noted above, beam steering optics 613 may comprise a beam deflection optics component and a beam focusing optics component. The B(Vz_corr) signal may be coupled to the beam focusing optics to correct vibrational displacements along the z-axis of the charged particle or laser beam impinging on the surface of target substrate 606.

Figure 7:
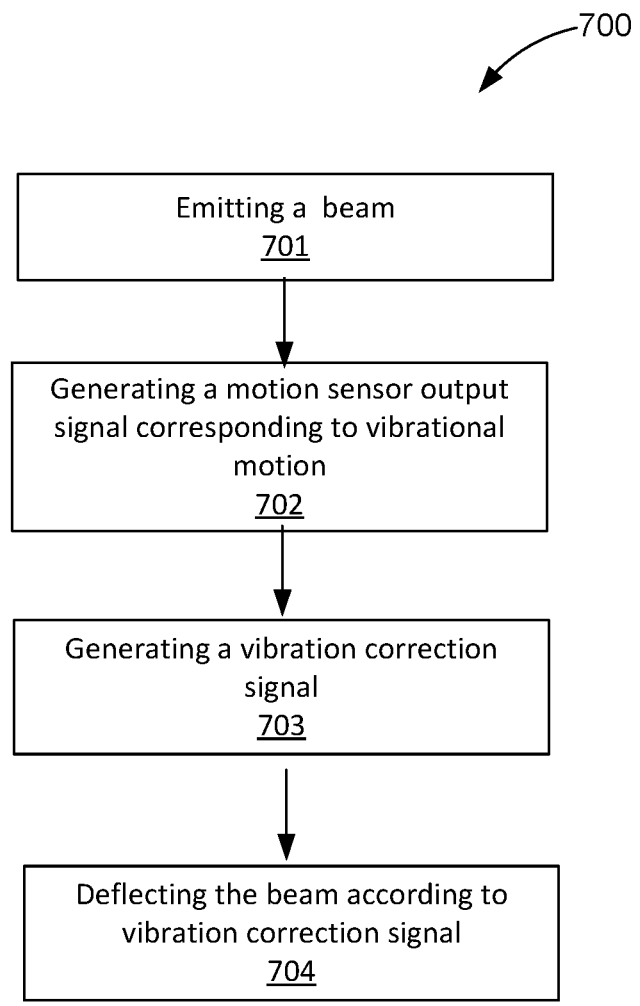
FIG. 7 illustrates a flow chart of an exemplary method of operation of a beam instrument employing beam steering vibrational motion correction by a feedback control loop, according to some embodiments of the disclosure.

FIG. 7 illustrates flow chart 700 of an exemplary method of operation of a beam instrument employing beam steering vibrational motion correction by a feedback control loop, according to some embodiments of the disclosure.

At operation 701, an instrument employing a charged particle beam or a laser beam (henceforth "beam") is in operation, whereby a source emits a beam incident on a target substrate (e.g., target substrate 103. For a charged particle beam, the source may be an electron gun and/or column, or an ion source, as shown in FIG. 1. A source may be laser head in instruments based on a guided laser beam, such as a confocal laser microscope or a direct-write lithography tool. Other beam instruments have been described above. A charged particle beam may be an electron beam emitted by thermionic emission from a filament and collimated by electrostatic or electromagnetic fields within a transit column, exiting into a vacuum chamber and passing through beam optics before impinging on a target substrate. Likewise, an ion beam may be formed by ionization of a noble gas or from liquid metal vapor, where a low-melting metal such as gallium is employed.

At operation 702, vibrational motion analogs, such as voltage signals from motion sensors coupled to the target substrate, may be input to a feedback control loop, such as feedback control loops 200-600, described above. Motion sensor signals may be analog voltages, for example, Vs as shown in FIG. 3, or binary encored data signals that are proportional to vibrational displacement or to acceleration of the target substrate of a target substrate. The vibrational motion may be relative to zero-point position of the target substrate or to the beam position.

Motion sensors may be inertial sensors, such as an accelerometer, or position sensors, such as an interferometric positional sensor. Motion sensors may have sufficient sensitivity to respond to movements of 10 nm or less. Signals from motion sensors may be analog voltages proportional to vibrational amplitudes. Alternatively, motion sensor signals may be binary data representing encoded position information. As an example, an interferometric sensor may comprise an electronic circuit that encodes displacement data from an interferogram created in a remote sensor head, and outputs a binary stream.

Inertial sensors may directly measure inertial forces on a proof mass suspended on a cantilever. The signal output may be an analog voltage that is proportional to the acceleration experienced by the proof mass. A voltage signal proportional to the inertial forces may be generated piezoresistively or capacitively. Inertial sensors may be MEMS accelerometers, for example, having integrated miniaturized components. The output of an inertial sensor may be directly read or integrated electronically to convert to velocity or positional data. Multiple sensors may be mechanically coupled to the target substrate to measure vibrations along orthogonal axes.

At operation 703, signals from motion sensors may be read by a central processor unit (e.g., CPU 108, FIG. 1). The CPU may subtract a reference value from the raw sensor input, generating an error or correction value that is relative to a reference value, for example a zero-point position of the target substrate. Optionally, the sensor signal may be pre-referenced to a zero-point value. For example, an interferometric signal may be automatically referenced to a zero point within the optical system of the sensor. The zero point may correspond to a position of the target substrate if no vibrations are present.

The CPU may access binary beam pattern data that is to be output to one or more DACs from a lookup table buffer. The beam pattern data may be a digital sawtooth or triangle waveform repeated a number of times in the x-direction and in the y-direction to form a raster scan pattern. The beam pattern data may be read by a first DAC to generate a stream of incremental beam displacements in the x direction and a second DAC to generate a stream of incremental beam displacements in the y-direction. The same digital waveform may be employed for each direction. Each digital waveform comprises a number of data points representing discrete voltages to be output from a DAC as a function of time. Time increments may be determined by an on-board clock in the CPU or in the DAC.

Alternatively, the beam pattern data may correspond to a static x, y position on the target substrate. For example, a focused ion beam (FIB) remains at a signal location, defined by an x, y coordinate, on the target substrate. The FIB may remain at the x, y coordinate until moved to a different x, y coordinate by an operator. A spot may be formed on the surface of the target substrate by the FIB that may be distorted by vibrational motion of the target substrate relative to the beam.

The CPU may sum the computed error values with the beam pattern signal data to compensate vibrational motion along pre-defined x-, y- and z-axes. As noted above, vibrational displacements may be sensed by the motion sensors and sampled by the CPU at high rates, for example, at sample rates above 100 MHz. Thus, vibrational correction signals may be updated every 10 to 20 microseconds, for example. The beam pattern signal may be updated accordingly, enabling several updates for a single vibrational cycle. In this manner, the digital feedback control loop may be critically damped, preventing system oscillations and enabling accurate vibration compensation.

At operation 704, the summed beam pattern and displacement correction values are output to DACs that convert the binary data from the CPU to analog voltages. The analog voltages generated by the DACs comprise the correction signals. One DAC for each axis (x, y and z) may be employed. Voltage outputs from each of the DACs may be coupled to an amplifier stage, where the signals are amplified to provide high voltages or power to beam steering optics. The beam steering optics may comprise electrostatic or electromagnetic beam focusing and deflection optics for controlling charged particle beams. Electrostatic beam optics comprise an electrode quadrupole, for example, to generate electric field gradients. Electromagnetic beam optic may comprise an array of coils in a quadrupolar or cylindrical arrangements, for example, to generated magnetic field gradients. Charged particles experience Lorentz forces to cause beam deflection, where the beam axis may be deflected from the z-axis and is no longer coaxial therewith. Beam focusing optics may be similarly configured, whereby beam focusing is accomplished by converging and diverging the beam by deflection optics while maintaining the center of the beam on a z-axis Alternatively, the beam-steering optics may comprise a mirror array for focusing and deflecting a laser beam. A mirror array may be a MEMS device comprising multiple light-reflective mirrors integrated onto piezoelectric actuators. The piezoelectric actuators may be electrically coupled to the output of the amplifier stage.

The correction signals may cause normal beam pattern deflection to be modulated by vibrational motion corrections. Thus, the signals fed to the beam optics comprise both the beam pattern signals summed with the vibrational motion correction signals. The summation occurs in real time, thus vibrational motion of the target substrate may be compensated in real time to maintain a beam spot at a x, y, z coordinate with a deviation that is within acceptable limits to avoid vibrational smearing of the spot.

Figure 8:
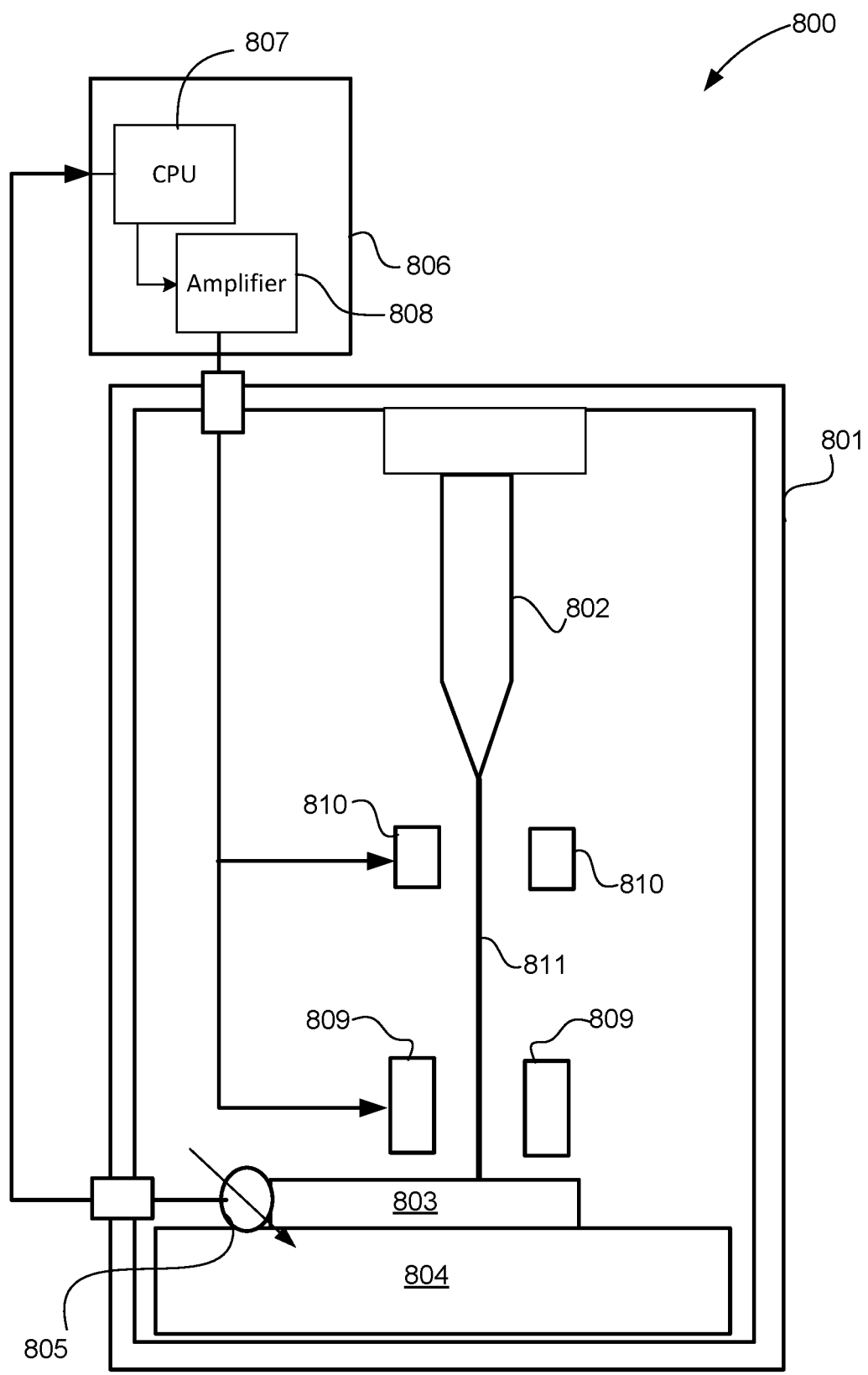
FIG. 8 illustrates a profile view in the x-z plane of an exemplary charged particle beam instrument according to some embodiments of the disclosure.

FIG. 8 illustrates a profile view in the x-z plane of an exemplary charged particle beam instrument 800, according to some embodiments of the disclosure.

Charged particle beam instrument 800 comprises vacuum chamber 801 enclosing beam column 802, target substrate (or device under inspection, DUI) 803. Vacuum chamber 801 may be under a high vacuum (e.g., <$10^{-7}$ torr) or an ultra-high vacuum (e.g., <$10^{-10}$ torr) to mitigate collisions of charged particles with air or gas molecules. Target substrate or DUI 803 is supported on platform 804. Motion sensor 805 is disposed in proximity to platform 804. Motion sensor 805 may be mechanically coupled to target substrate 803 or platform 804. Motion sensor 805 is electrically coupled to electronic control module 806. In some embodiments, electronic control module 806 comprises CPU 807 and amplifier stage 808. In some embodiments, electronic control module 806 may comprise an amplifier stage and peripheral digital signal generator (not shown).

Column 802 may be part of a charged particle (electron or ion) source, and comprise positive electrodes (e.g., anodes) to collimate and accelerate the charged particles. The charged particle source may produce electrons for an electron beam by thermionic emission of a heated filament. Ion beams may be produced by ionization of liquid metals, such as gallium or ionization of noble gas ions (e.g., argon, xenon) by various ionization techniques (e.g., liquid metal ionization sources, noble gas plasma formation) known in the art. Column 802 may comprise electrodes to collimate and accelerate the charged particles, which may exit column 802 through its tip as charged particle beam 811.

Beam deflection (e.g., beam steering, beam scanning) optics 809 and beam focusing optics 810 may be included within charged particle beam instrument. Beam deflection optics 809 and beam focusing optics may comprise electromagnet coils in a symmetric arrangement of coils, such as a toroidal or quadrupolar configuration, for generating controllable symmetric and asymmetric magnetic field gradients to deflect charged-particle beam 811 along the x and y axes according to Lorentz's law. Magnetic fields may be generated by flowing currents through coils contained within deflection beam optics 809 and focusing beam optics 810. Electronic control module 806 may source currents by coupling beam optics 809 and 810 to amplifier stage 808, which may be a power amplifier.

In some embodiments, beam deflection optics 809 comprise an electrode array for creating a dynamic electric field through which charged-particle beam 811 passes. Electric fields may be generated by imposing voltages on an electrode array within beam deflection optics 809 by electronic control module 806. Charged particle beams such as electron beams or ion beams may be subject to Lorentz forces caused by controlled electric field gradients, causing controlled deflection of charged-particle beam 811. High voltages required to generate sufficient electric fields may be generated by a voltage amplification stage (not shown) within electronic control module 806. As an electrode array in beam deflection optics 809 may present a high impedance to the output of electronic control module 806, power requirements for amplifier stage 808 may be low.

Beam focusing optics 810 may control beam focal point, thus manipulating charged-particle beam 811 along the z-axis. Beam focusing optics 810 may cause charged particle beam 811 to converge and diverge, changing the focal point and hence the spot size. At the focal point, the beam diameter may be at a minimum. Beam focusing optics 810 may be operated to set the focal point of charged particle beam 811 to coincide with the surface of target substrate 803.

Motion sensor 805 may be a single or multiple inertial or positional motion sensors that detect vibrational motion of target substrate 803 and/or platform 804. For example, motion sensor 805 may be an accelerometer, an interferometer, a linear position decoder, or other suitable sensor that may detect motion by inertial effects or measurement of displacement.

Motion sensor 805 may be electrically coupled to CPU 807 shown as a part of the circuitry within electronic control module 806. Motion sensor 805 may output a voltage signal that is proportional to vibrational displacement and/or forces. For the latter, an accelerometer may output a voltage signal that is proportional to the acceleration of the motion of target substrate 803 or platform 804.

Platform 804 may be rigidly affixed to vacuum chamber 801 directly or indirectly, for example, by brackets. Motion sensor 805 may be coupled to platform 804 directly, sensing any vibrational motion of platform 804 due to mechanical coupling through the walls or base of vacuum chamber 801. In implementations, target substrate 803 is generally a DUI or a semiconductor wafer that is temporarily affixed to platform 804. As target substrate 803 may be rigidly affixed to platform 804, target substrate 803 may experience the same vibrational motion experienced by platform 804. Thus, while not directly coupled to target substrate 803, motion sensor 805 may reliably measure the vibrational displacements of target substrate 803. In some embodiments, motion sensor 805 may be part of a jig to affix target substrate 803 to platform 804, thus have a direct mechanical coupling to target substrate 803.

Electronic control module 806 may comprise a microprocessor, such as CPU 807, providing a digital signal processing function. CPU 807 may be electrically coupled to motion sensor 805 and beam optics 809 and 810, whereby CPU 807 may comprise an input port to receive a raw signal output from motion sensor 805 either as an analog voltage or digitized into a binary code by a discrete or integrated analog-to-digital converter (ADC). CPU 807 may also comprise an output port to couple an error or correction signal to an analog output stage (e.g., amplifier 808) that is coupled to beam optics 809 and 810, completing a closed feedback control loop between sensor 805 and beam optics 809 and 810. In some embodiments, CPU 807 may execute a feedback algorithm that is a part of software stored in a memory coupled to CPU 807. For example, a portion of the feedback algorithm may be executed by CPU 807 to compute a correction signal value that may be relayed to beam deflection optics 810 to deflect charged particle beam 811 in such a way as to compensate a vibrational displacement of target substrate 803. The correction signal value may be output by CPU 807 directly as a binary value to a discrete or integrated digital-to-analog converter (DAC).

Amplifier 808 may comprise multiple voltage and/or power amplifiers that are coupled to beam optics 809 and 810. Electrostatic optics may present high impedances to the output of amplifier 808, thus power requirements of amplifier 808 may be small, not necessitating power amplification. Electromagnetic optics may require large currents and present low impedances to amplifier 808, imposing higher power requirements. Thus, amplifier 808 may have power delivery capabilities.

Figure 9:
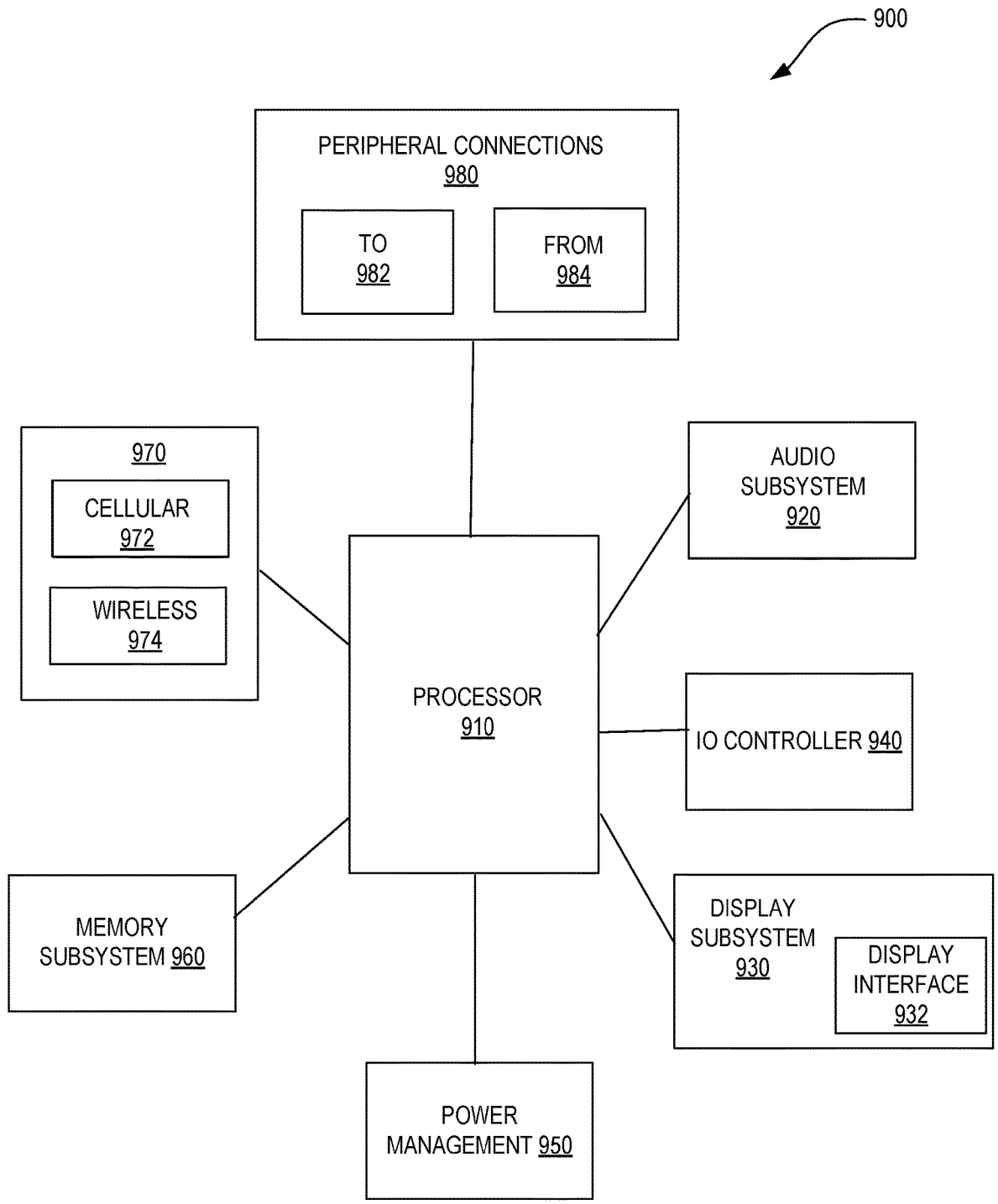
FIG. 9 illustrates a block diagram of a computing device as part of a system-on-chip (SoC) package in an implementation of one or more integrated circuit dies processed in a e-beam tool comprising a feedback control loop employing vibration compensation beam steering optics, according to some embodiments of the disclosure.

FIG. 9 illustrates a block diagram of computing device 900 as part of a system-on-chip (SoC) package in an implementation of one or more integrated circuit dies processed in an e-beam tool comprising a feedback control loop employing vibration compensation beam steering optics, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. Multichip IC packages, such as, but not limited to, a single- or multi-core microprocessor (e.g., representing a central processing unit), logic dies, RF dies, high power dies, memory dies, antenna dies, comprises a packages substrate having, for example.

In some embodiments, computing device has wireless connectivity (e.g., Bluetooth, WiFi and 5G network). It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 910 represents a CPU or a GPU, and can include one or more physical devices, such as microprocessors, application processors, microcontrollers, programmable logic devices, or other processing means. Processor 910 may be coupled to a memory controller or high-speed serial I/O interface controller, as disclosed. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art).

Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus, comprising a beam emitter to emit a beam comprising electrons, ions or laser-light photons toward a target substrate a motion sensor to detect mechanical vibrations of the target substrate, wherein the motion sensor is mechanically coupled to the target substrate a processor coupled to an output of the motion sensor, the processor to generate a vibration correction signal proportional to the mechanical vibrations detected by the motion sensor; and beam steering optics coupled to the processor, the beam steering optics to deflect the beam according to the vibration correction signal to compensate for the mechanical vibrations of the target substrate.

Example 2 includes all of the features of example 1, wherein the motion sensor is a first motion sensor, and a second motion sensor is mechanically coupled to the beam emitter and wherein the second motion sensor is electrically coupled to the processor.

Example 3 includes all of the features of claim 1 or 2, wherein the beam steering optics receives the second signal, wherein the second signal is the sum of a primary signal and the first signal, and wherein the primary signal is to control the primary position of the beam.

Example 4 includes all of the features of any one of examples 1 through 3, wherein the beam steering optics comprises a primary beam steering component to control a primary position of the beam, and a secondary beam steering component to deflect the beam in accordance with the first signal, wherein the secondary beam steering component is electrically coupled to the electronic control circuit to receive a signal proportional to the first signal.

Example 5 includes all of the features of any one of examples 1 through 4, wherein the beam steering optics comprise: an electrostatic lens comprising deflection electrodes to steer a beam comprising charged particles; a magnetic lens comprising one or more magnetic field coils to steer a beam comprising charged particles; or one or more actuators to control orientations of one or more reflective mirrors for deflecting a laser light beam.

Example 6 includes all of the features of any one of examples 1 through 5, further comprising a vacuum chamber, wherein the beam emitter, beam steering optics, motion sensor and target substrate are within the vacuum chamber.

Example 7 includes all of the features of example 6, wherein the vacuum chamber is part of an electron microscope, a focused ion beam milling instrument or an electron beam lithography instrument.

Example 8 includes all of the features of any one of examples 1 through 7, wherein the motion sensor is a first motion sensor, and a second motion sensor is mechanically coupled to the beam emitter, wherein first motion sensor is to produce a first sensor signal and the second motion sensor is to produce a second sensor signal coupled to the position feedback loop.

Example 9 is a method for providing mechanical vibration compensation of a beam position, comprising emitting a collimated beam of electrons, ions or light toward a target substrate, generating a motion sensor output signal proportional to vibrational motion of the target substrate, wherein the motion sensor output signal comprises a signal proportional to a magnitude of lateral vibrations of the target substrate, generating a vibration correction signal based on a reference position of the target substrate and the motion sensor output signal, and deflecting the collimated beam according to the vibration correction signal to compensate for the lateral vibrations of the target substrate relative to the reference position.

Example 10 includes all of the features of example 9, wherein the beam steering circuit is electrically coupled to an array of electrodes, wherein coupling the beam deflection signal to the beam steering circuit comprises outputting the beam deflection signal comprising the vibration correction signal to the array of electrodes to deflect a beam of charged particles by a dynamic electric field corresponding to the vibration correction signal.

Example 11 includes all of the features of examples 9 or 10, wherein the beam steering circuit is electrically coupled to an electromagnet coil, wherein coupling the beam deflection signal to the beam steering circuit comprises outputting the beam deflection signal comprising the vibration correction signal to the electromagnet coil to deflect a charged particle beam by a dynamic magnetic field corresponding to the vibration correction signal.

Example 12 includes all of the features of any one of examples 9 through 11, wherein beam steering circuit is electrically coupled to an actuator that is mechanically coupled to an array of mirrors, wherein coupling the beam deflection signal to the beam steering circuit comprises outputting the beam deflection signal comprising the vibration correction signal to the actuator to deflect a beam of light by rotating and displacing the array of mirrors according to the vibration correction signal.

Example 13 includes all of the features of any one of examples 9 through 12, wherein the beam deflection signal comprises a first voltage corresponding to the vibration correction signal summed with a second voltage corresponding to the drive signal.

Example 14 includes all of the features of any one of examples 9 through 13, wherein generating a deflection signal by summing the vibration correction signal with a drive signal comprises programming the function generator to generate a dynamic voltage following a triangle waveform, a dynamic voltage following a sinusoidal voltage waveform, or a static voltage waveform, wherein the drive signal controls the position of the beam according to a programmed waveform.

Example 15 includes all of the features of any one of examples 9 through 14, wherein the function generator comprises a programmable digital signal synthesizer or comprises multiple analog wave generators having a human-machine interface.

Example 16 includes all of the features of any one of examples 9 through 15, generating a vibration correction signal within the position feedback loop by subtracting a reference voltage from the motion sensor output signal comprises setting the reference voltage to be proportional to a set point position of the target substrate.

Example 17 includes all of the features of any one of examples 9 through 16, wherein generating a motion sensor output signal proportional to the vibrational motion of the substrate comprises generating a first motion sensor signal from a first motion sensor, and a second motion sensor signal from a second motion sensor, wherein the first motion sensor is orthogonal to the second motion sensor.

Example 18 is at least one machine readable medium comprising a plurality of instructions that, in response to being executed on a device, cause the device to provide vibration compensation of a beam by receiving a motion sensor signal value, wherein the motion sensor signal value is proportional to a magnitude of vibrational motion of a target substrate, determining a correction signal value based on a stored reference value and the motion sensor signal value, and outputting the correction signal value to a digital-to-analog converter coupled to the device, wherein the correction signal value is to be converted to a voltage coupled to a beam steering optics to deflect the beam to compensate the vibrational motion of the target substrate.

Example 19 includes all of the features of example 18, wherein the plurality of instructions further comprises directing the device to compute a primary beam position signal value.

Example 20 includes all of the features of example 19, wherein the plurality of instructions further comprises directing the device to compute a sum of the primary beam position signal value and the correction signal value and to output the sum to a digital-to-analog converter coupled to the device.

Example 21 includes all of the features of any one of examples 18 through 20, wherein the plurality of instructions comprises parameters that are adjustable by a human-machine interface readable by the device.

We claim:

1. An apparatus, comprising:
   a beam emitter to emit a beam comprising electrons or ions toward a target substrate;
   a motion sensor to detect mechanical vibrations of the target substrate, wherein the motion sensor is mechanically coupled to the target substrate;
   a processor coupled to the motion sensor, the processor to receive an acceleration signal from the motion sensor, to determine a series of projections of positions of the target substrate based on the acceleration signal, and to generate a vibration correction signal based on the series of projections of positions of the target substrate; and
   beam steering optics coupled to the processor, the beam steering optics to deflect the beam according to the vibration correction signal to compensate for the mechanical vibrations of the target substrate.

2. The apparatus of claim 1, wherein the motion sensor is a first motion sensor, the apparatus further comprising a second motion sensor mechanically coupled to the beam emitter and electrically coupled to the processor.

3. The apparatus of claim 1, wherein the beam steering optics receives a second signal, wherein the second signal is the sum of a primary signal and the vibration correction signal, and wherein the primary signal is to control the primary position of the beam.

4. The apparatus of claim 1, wherein the beam steering optics comprises a primary beam steering component to control a primary position of the beam, and a secondary beam steering component to deflect the beam in accordance with the vibration correction signal, wherein the secondary beam steering component is electrically coupled to the processor to receive a signal proportional to the vibration correction signal.

5. The apparatus of claim 1, wherein the beam steering optics comprise an electrostatic lens comprising deflection electrodes to steer the beam or a magnetic lens comprising one or more magnetic field coils to steer the beam.

6. The apparatus of claim 1, further comprising a vacuum chamber, wherein the beam emitter, beam steering optics, motion sensor, and target substrate are within the vacuum chamber.

7. The apparatus of claim 6, wherein the vacuum chamber is part of an electron microscope, a focused ion beam milling instrument, or an electron beam lithography instrument.

8. A method, comprising:
   emitting a collimated beam of electrons or ions toward a target substrate;
   generating a motion sensor output signal proportional to vibrational motion of the target substrate, wherein the motion sensor output signal comprises an acceleration signal proportional to a magnitude of lateral vibrations of the target substrate;
   generating a series of projections of positions of the target substrate based on the acceleration signal, and a vibration correction signal based on the series of projections of positions of the target substrate; and
   deflecting the collimated beam according to the vibration correction signal to compensate for the lateral vibrations of the target substrate relative to a reference position of the target substrate.

9. The method of claim 8, wherein deflecting the collimated beam comprises outputting a beam deflection signal comprising the vibration correction signal to an array of electrodes to deflect the collimated beam by a dynamic electric field corresponding to the vibration correction signal.

10. The method of claim 8, wherein deflecting the collimated beam comprises outputting a beam deflection signal comprising the vibration correction signal to an electromagnet coil to deflect the collimated beam by a dynamic magnetic field corresponding to the vibration correction signal.

11. The method of claim 8, wherein deflecting the collimated beam comprises outputting a beam deflection signal comprising a first voltage corresponding to the vibration correction signal summed with a second voltage corresponding to a drive signal.

12. The method of claim 8, wherein generating the motion sensor output signal comprises generating a first motion sensor signal from a first motion sensor and a second motion sensor signal from a second motion sensor, wherein the first motion sensor is orthogonal to the second motion sensor.

13. At least one non-transitory machine readable medium comprising a plurality of instructions that, in response to being executed on a device, cause the device to provide vibration compensation of a beam by:
   receiving a motion sensor signal, wherein the motion sensor signal is proportional to a magnitude of vibrational motion of a target substrate and wherein the motion sensor signal comprises an acceleration signal;
   determining a series of projections of positions of the target substrate based on the acceleration signal and a vibration correction signal based on the series of projections of positions of the target substrate; and
   outputting the vibration correction signal value to a digital-to-analog converter coupled to the device, wherein the vibration correction signal value is to be converted to a voltage coupled to a beam steering optics to deflect the beam to compensate for the vibrational motion of the target substrate.

14. The at least one non-transitory machine-readable medium of claim 13, wherein the plurality of instructions further comprise that, in response to being executed on the device, cause the device to provide vibration compensation of the beam by directing the device to compute a primary beam position signal value.

15. The at least one non-transitory machine-readable medium of claim 14, wherein the plurality of instructions further comprise that, in response to being executed on the device, cause the device to provide vibration compensation of the beam by directing the device to compute a sum of the primary beam position signal value and the vibration correction signal value and to output the sum to a digital-to-analog converter coupled to the device.

16. The at least one non-transitory machine-readable medium of claim 13, wherein the plurality of instructions comprises parameters that are adjustable by a human-machine interface readable by the device.

* * * * *